(12) United States Patent
Menkhoff et al.

(10) Patent No.: US 8,775,492 B2
(45) Date of Patent: Jul. 8, 2014

(54) DIGITAL FILTER AND METHOD OF DETERMINING ITS COEFFICIENTS

(75) Inventors: Andreas Menkhoff, Oberhaching (DE); Holger Gryska, München (DE)

(73) Assignee: Intel Mobile Communications GmbH, Neubiberg (DE)

( * ) Notice: Subject to any disclaimer, the term of this patent is extended or adjusted under 35 U.S.C. 154(b) by 2756 days.

(21) Appl. No.: 11/410,395

(22) Filed: Apr. 24, 2006

(65) Prior Publication Data

US 2006/0250287 A1    Nov. 9, 2006

(30) Foreign Application Priority Data

Apr. 22, 2005  (DE) .......................... 10 2005 018 858

(51) Int. Cl.
*G06F 17/17* (2006.01)

(52) U.S. Cl.
USPC ........................................................ 708/313

(58) Field of Classification Search
USPC ......................................... 708/300–323, 290
See application file for complete search history.

(56) References Cited

U.S. PATENT DOCUMENTS

| | | | |
|---|---|---|---|
| 5,751,615 A | | 5/1998 | Brown |
| 5,831,879 A | * | 11/1998 | Yom et al. ..................... 708/301 |
| 6,034,628 A | * | 3/2000 | Draxelmayr .................. 708/313 |
| 6,260,053 B1 | * | 7/2001 | Maulik et al. ................. 708/313 |
| 6,466,615 B1 | * | 10/2002 | Song .............................. 708/313 |
| RE38,144 E | * | 6/2003 | Draxelmayr .................. 708/313 |
| 6,604,119 B1 | * | 8/2003 | Duttweiler .................... 708/313 |
| 6,829,629 B1 | * | 12/2004 | Magesacher et al. ......... 708/313 |
| 7,613,760 B1 | * | 11/2009 | Esposito et al. .............. 708/313 |
| 2003/0037083 A1 | * | 2/2003 | Todsen et al. ................ 708/313 |
| 2003/0069911 A1 | | 4/2003 | Piirainen |

FOREIGN PATENT DOCUMENTS

| | | |
|---|---|---|
| DE | 37 44 187 | 7/1989 |
| DE | 199 19 575 | 1/2001 |
| EP | 0 762 647 | 10/2000 |
| EP | 0 889 588 | 6/2003 |
| EP | 0 940 009 | 2/2004 |

OTHER PUBLICATIONS

Chu, Shuni et al., "Multirate Filter Designs Using Comb Filters," IEEE Transactions on Circuits and Systems, vol. CAS-31, No. 11, pp. 913-924 (Nov. 1984).

Crochiere, Ronald E., et al., "Multirate Digital Signal Processing," AT&T, Structures and Network Theory for Multirate Systems, pp. 68-71 (Mar. 21, 1983).

* cited by examiner

*Primary Examiner* — Chuong D Ngo (57) ABSTRACT

A digital filter converts a digital input sequence into a digital output sequence. The digital filter includes an integrator stage having a plurality of closed-loop controlled time-delay elements. The integrator stage is configured to have each closed-loop controlled time-delay element set to a value which is predetermined for the respective closed-loop controlled time-delay element. The digital filter includes a further stage. The integrator stage and the further stage are configured to operate at different clock frequencies.

17 Claims, 7 Drawing Sheets

DIGITAL FILTER AND METHOD OF DETERMINING ITS COEFFICIENTS

CROSS-REFERENCE TO RELATED APPLICATIONS

This Utility Patent Application claims priority to German Patent Application No. DE 10 2005 018 858.3, filed on Apr. 22, 2005, which is incorporated herein by reference.

BACKGROUND

In digital signal processing, there is a wide variety of filters for transforming a scanning rate. A scanning rates transformation refers to a conversion of an input sequence of a circuit, for example a filter, into an output sequence of the circuit, the input sequence and the output sequence having different signal rates or scanning rates.

With a finite impulse response (FIR) filter, very simple signal processing is effected at a high clock-pulse rate and complicated signal processing at a comparatively low clock-pulse rate. A FIR filter may be constructed in such a way that each input value is weighted with a filter coefficient and a sum of all weighted input values is subsequently formed. As weighting (i.e., multiplication by a coefficient) and addition frequently have to be carried out, the circuitry of digital signal processes is deliberately designed normally in such a way that the weighting and addition take place in one step or one command.

In FIR filters, a distinction is made between decimation filters and interpolation filters, which generally comprise an integrator stage and a further stage which operate at different clock frequencies. In a decimation filter, the input sequence has a higher signal rate than the output sequence whereas, in an interpolation filter, essentially the opposite occurs.

With a decimation filter having a decimation factor of 32 (i.e., ratio of the higher signal rate to the lower signal rate), 128 multiplications and additions are required at the low clock rate (e.g., during 128 taps), and this corresponds to four multiplications and additions at the high clock rate.

With FIR filters, almost randomly configured attenuation can be achieved in the pass and blocking band with respect to the transfer function of the FIR filters.

If a very narrow pass band is to be achieved with an FIR filter to be implemented with minimal expense, comb filters are frequently used (see "Multirate Filter Designs Using Comb Filters", IEEE Transactions Circuit and Systems, pages 913-924, November 1984). During interpolation (a comb filter is used as the interpolation filter), the input sequence is applied to the further stage at a comparatively low signal rate and is converted into an output sequence with a high signal rate. During decimation, on the other hand (a comb filter is used as the decimation filter), the input sequence is applied to the integrator stage at a comparatively high signal rate and is converted into an output sequence with a comparatively low signal rate. In other words, the integrator stage of the comb filter operates at a higher clock frequency than its further stage, both as an interpolation filter and as a decimation filter. The integrator stage comprises at least one closed-loop controlled time-delay element or an integrator and the further stage comprises at least one time-delay element. A higher order comb filter is obtained if the integration stage comprises a plurality of closed-loop controlled delay elements or the further stage a plurality of time-delay elements. The structure of a comb filter is simple to construct in terms of circuitry.

However, in the comb filter the zero points of the transfer function are located on top of one another and not side by side, so the transfer function of the comb filter has narrow blocking bands, which explains the name "comb filter".

Further, the closed-loop controlled time-delay elements or integrators of the integrator stage have an infinite memory, so a bit error which has occurred once, for example due to leakage, can only be corrected by disconnecting the comb filter.

For these and other reasons, there is a need for the present invention.

SUMMARY

One aspect of the present invention provides a digital filter configured to convert a digital input sequence into a digital output sequence. The digital filter includes an integrator stage having a plurality of closed-loop controlled time-delay elements. The integrator stage is configured to have each closed-loop controlled time-delay element set to a value which is predetermined for the respective closed-loop controlled time-delay element. The digital filter includes a further stage. The integrator stage and the further stage are configured to operate at different clock frequencies.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of a digital filter, has a transfer function which can be approximated to the transfer function of a FIR filter. One embodiment of a method determines coefficients of the digital filter.

One embodiment provides a digital filter in which the transfer function can also have broader blocking bands than a comb filter. One embodiment provides a digital filter in which a bit error, once it has occurred, is quickly corrected in comparison to a comb filter. One embodiment provides a digital filter which has lower power consumption than a comb filter.

One embodiment provides a method of determining the coefficients of a digital filter of this type.

One embodiment provides a digital filter which converts a digital input sequence into a digital output sequence, the input sequence having a different signal rate from the output sequence. The digital filter comprises an integrator stage and a further stage, the integrator stage and the further stage operating at different clock frequencies. The integrator stage possesses a plurality of closed-loop controlled time-delay elements and the digital filter is configured in such a way that each of these closed-loop controlled time-delay elements (or feedback time-delay elements) can be set to a value which is predetermined for the respective closed-loop controlled time-delay element, in particular to 0, at an instant which is identical for all closed-loop controlled time-delay elements.

In one embodiment, all closed-loop controlled time-delay elements of the digital filter can be set to a predetermined value in that the digital filter comprises a controller which, as a function of a predetermined state of the digital filter, activates a specific input (for example a reset input) of each closed-loop controlled time-delay element in such a way that the respective closed-loop controlled time-delay element is set to the corresponding predetermined value.

In one embodiment, any bit error present is eliminated when the closed-loop controlled time-delay elements are set to a predetermined value. In addition, the digital filter according to one embodiment can be configured in such a way that it has a transfer function at which the zero points are located side by side, which is why the transfer function has broader blocking bands than a transfer function of a comb filter.

The size (e.g., the word width) of the closed-loop controlled time-delay elements can have a smaller configuration than conventional digital filters if the closed-loop controlled time-delay elements are reset to 0, and this leads to lower power consumption than with conventional filters.

In one embodiment, if the digital filter is configured as a decimation filter, the integrator stage is arranged on the input side and the further stage on the output side. The further stage has, on the input side, a weighting network which produces a linear combination of the outputs of the integrator stage with coefficients of the digital filter, and, on the output side, a time-delay element network comprising one or more time-delay elements. The outputs of the integrator stage are connected to the inputs of the weighting network and the outputs of the weighting network to the inputs of the time-delay element network. In this case, the closed-loop controlled time-delay elements of the integrator stage as well as the time-delay elements of the further stage, if the further stage comprises a plurality of time-delay elements, can be arranged in series. In addition, only each respective Nth value of each output of the closed-loop controlled time-delay elements can form an input value for the further stage.

The decimation filter can be configured in such a way that it comprises almost any desired transfer function by selecting the coefficients of the digital filter accordingly.

In one embodiment, if the digital filter is configured as an interpolation filter, the further stage is arranged on the input side and the integrator stage on the output side. In this case, the further stage comprises, on the input side, a time-delay element network comprising one or more time-delay elements and, on the output side, a weighting network which produces, in particular, a linear combination of output values of the time-delay element network and coefficients of the digital filter. The closed-loop controlled time-delay elements of the integrator stage and the time-delay elements of the further stage, if the further stage comprises a plurality of time-delay elements, can in turn be arranged in series. In particular, the digital filter can be configured in such a way that each output value of the weighting network forms an input value of the integrator stage for each Nth clock pulse of the integrator stage.

As with decimation filters according to some embodiments, almost any transfer function can be performed by suitable choice of the coefficients of interpolation filters according to some embodiments.

In one embodiment, some or all closed-loop controlled time-delay elements of the integrator stage can be analogue integrators (e.g., configured using switched capacitor technology), if the closed-loop controlled time-delay elements are reset periodically.

Similar integrators can advantageously be constructed more compactly than digitally constructed closed-loop controlled time-delay elements. However, they can only be used if the digital filter is configured in such a way that an overrun of the closed-loop controlled time-delay elements or integrators is avoided. According to one embodiment, this is the case when the closed-loop controlled time-delay elements or, in this embodiment, the analogue integrators are periodically reset.

One embodiment also provides a method of determining coefficients for a digital filter. In this case, a pulse response from a predetermined FIR filter is divided into L segments, and a polynomial of M-1$^{th}$ degree approximated to the respective segment is determined for each segment. M*L coefficients of the digital filter are then determined from the M*L coefficients of the polynomials.

In one embodiment, there are advantages to describing the digital filter not as the sum of weighted input values but as the sum of weighted integrator outputs during decimation or the sum of weighted time-shifted input values during interpolation. If a pulse is applied as the input signal, for example in the case of a decimation filter according to the invention, the time function of the output values is a constant at the first integrator output seen from the input, a straight line at the second integrator output, a second order parabola at the third integrator output, a third order parabola at the fourth integrator output, etc.

One embodiment is suitable, in particular, for use in digital signal processing, for converting a digital input current with one rate into a digital output current with a different rate, the transfer function corresponding to that of an FIR filter. Other embodiments are not restricted to this application, but can be used to construct any digital filters.

Figure 1:
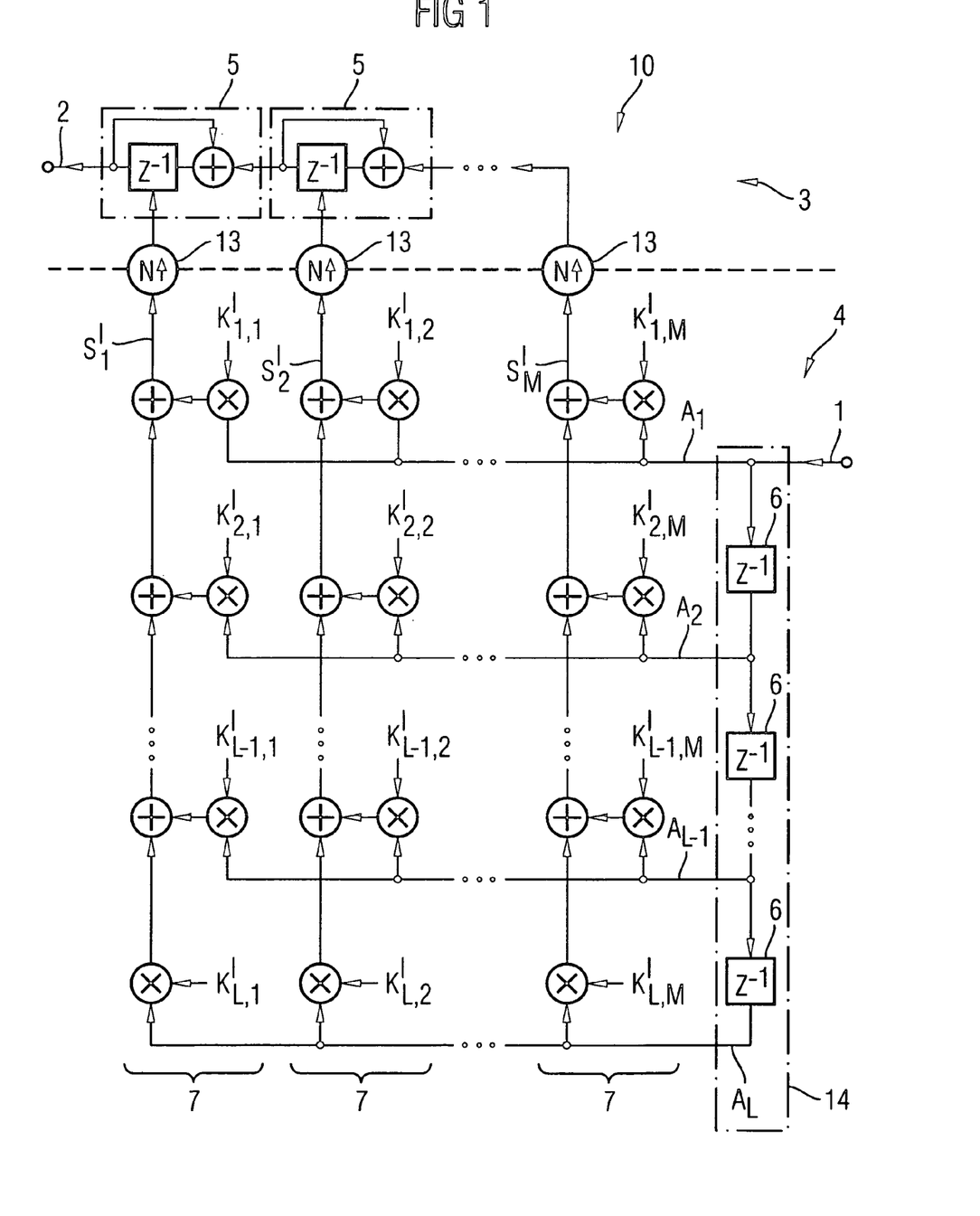
FIG. 1 illustrates one embodiment of an interpolation filter.

FIG. 1 illustrates an interpolation filter 10 according to one embodiment, which converts an input sequence 1 applied to an input 1 of the filter 10 into an output sequence 2 which can be tapped at an output 2 of the filter 10. A broken line divides the filter 10 into an integrator stage 3 and a further stage 4, the integrator stage 3 operating with a clock pulse which is faster by a factor N than the further stage 4. The clock pulse of the integrator stage 3 or further stage 4 is fed to registers of the integrator stage 3 or the further stage 4.

A time-delay element network or register network 14 comprising L−1 registers 6 arranged in series is arranged on the input side of the further stage 4, a respective output of one of the registers 6 being connected to an input of a subsequent register 6. The input of the first register 6 is connected to the input of the interpolation filter 10. Output values $A_2$-$A_L$ of the registers 6 and an output value or value $A_1$ of the input of the interpolation filter 10 form inputs of a weighting network comprising M portions 7. In each portion 7, each output value $A_1$-$A_L$ is multiplied by a respective coefficient $K^I_{1,1}$-$K^I_{L,M}$ and added up to produce M sums $S^I_1$-$S^I_M$. For each clock pulse of the further stage 4, in other words for each Nth clock pulse of the integrator stage 3, these sums are fed via M sampling circuits 13 to the integrator stage 3.

The integrator stage 3 includes M−1 closed-loop controlled registers (or feedback registers) 5 arranged in series, the output of each register being fed back to a respective summation node of which the output is connected to the input of the respective register. M−1 sums $S^I_1$-$S^I_{M-1}$ are loaded into the closed-loop controlled registers 5 at the Nth clock pulse of the integrator stage 3 respectively (i.e., the corresponding closed-loop controlled register is set to the value of the corresponding sum), the remaining sum $S^I_M$ being fed to the summation node of the closed-loop controlled register 5 apart removed from the output 2 of the integrator stage 3 or the interpolation filter 10.

Figure 2:
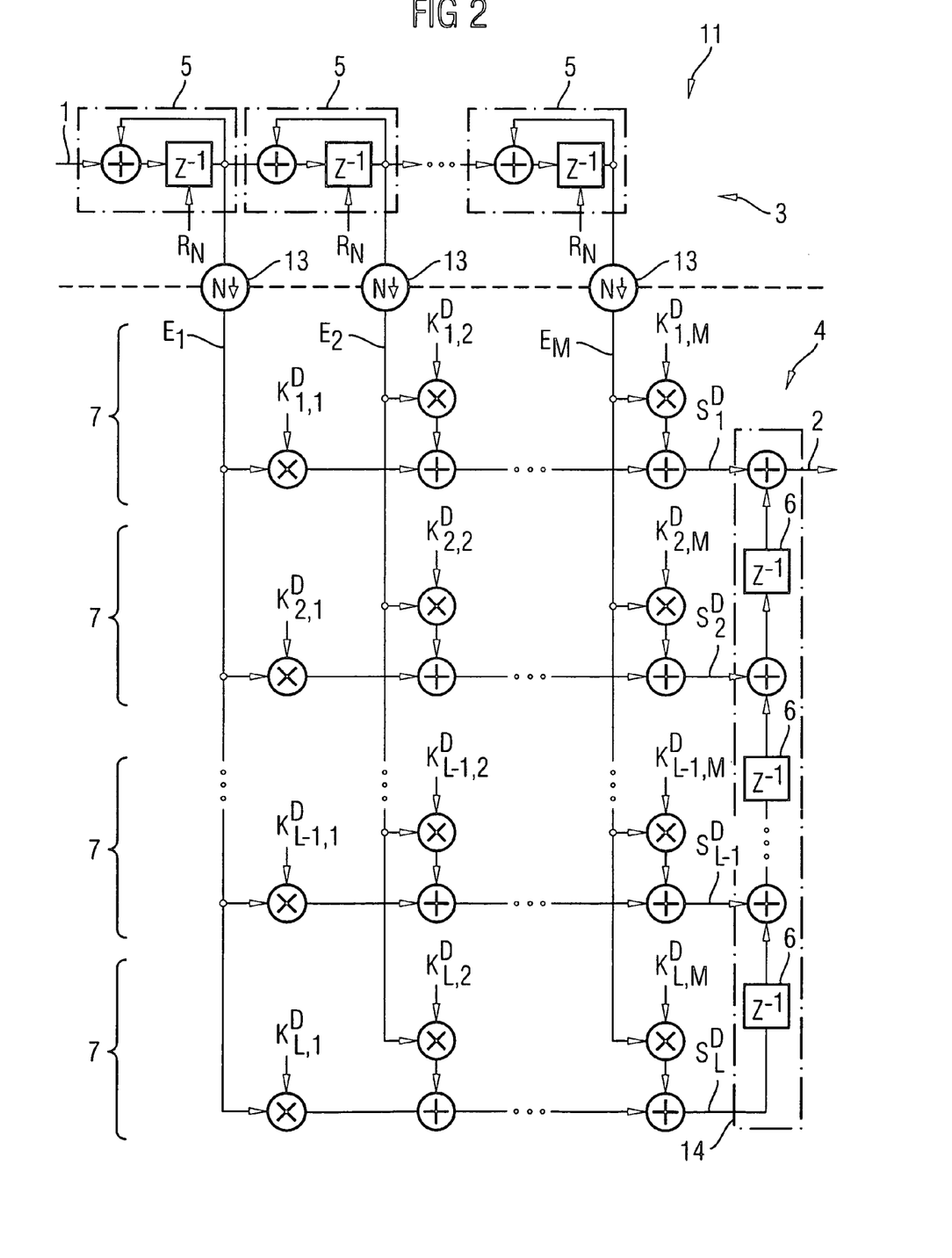
FIG. 2 illustrates one embodiment of a decimation filter.

FIG. 2 illustrates one embodiment of a decimation filter 11 which also comprises an integrator stage 3 and a further stage 4. The integrator stage 3 in turn operates with a clock pulse which is greater by the factor N than the clock pulse with which the further stage 4 operates. In contrast to the interpolation filter 10 illustrated in FIG. 1, the integrator stage 3 is arranged on the input side and the further stage 4 on the output side in the case of the decimation filter 11.

As with the interpolation filter 10, M closed-loop controlled registers 5 of the integrator stage 3 are arranged in series so that the output of a register is connected to a respective summation node of which the output is connected to the input of the next register. For each Nth clock pulse of the integrator stage 3, the values of the outputs of the closed-loop controlled registers 5 are fed to the further stage 4 as input values $E_1$-$E_M$ and, in addition, for each Nth clock pulse, the closed-loop controlled registers 5 are reset to the value 0.

The further stage 4 comprises a weighting network having L portions and a register network 14 comprising L−1 registers 6. In each portion 7, the input values $E_1$-$E_M$ are weighted with a respective coefficient $K^D_{1,1}$-$K^D_{L,M}$ and added together to produce, for each portion 7, a sum $S^D_1$-$S^D_L$ which is fed to the register network 14. This register network 14 comprises L−1 registers 6 arranged in series. Each register 6 is connected, on the output side, to a summation node to which a sum $S^D_1$-$S^D_{L-1}$ is also fed, the output of this summation node being connected to the input of the next register 6. The output of the summation node at the output of the last register 6 is the output 2 of the further stage 4 or of the decimation filter 11, whereas the sum $S^D_L$ is fed to the first register 6 on the input side.

Figure 3:
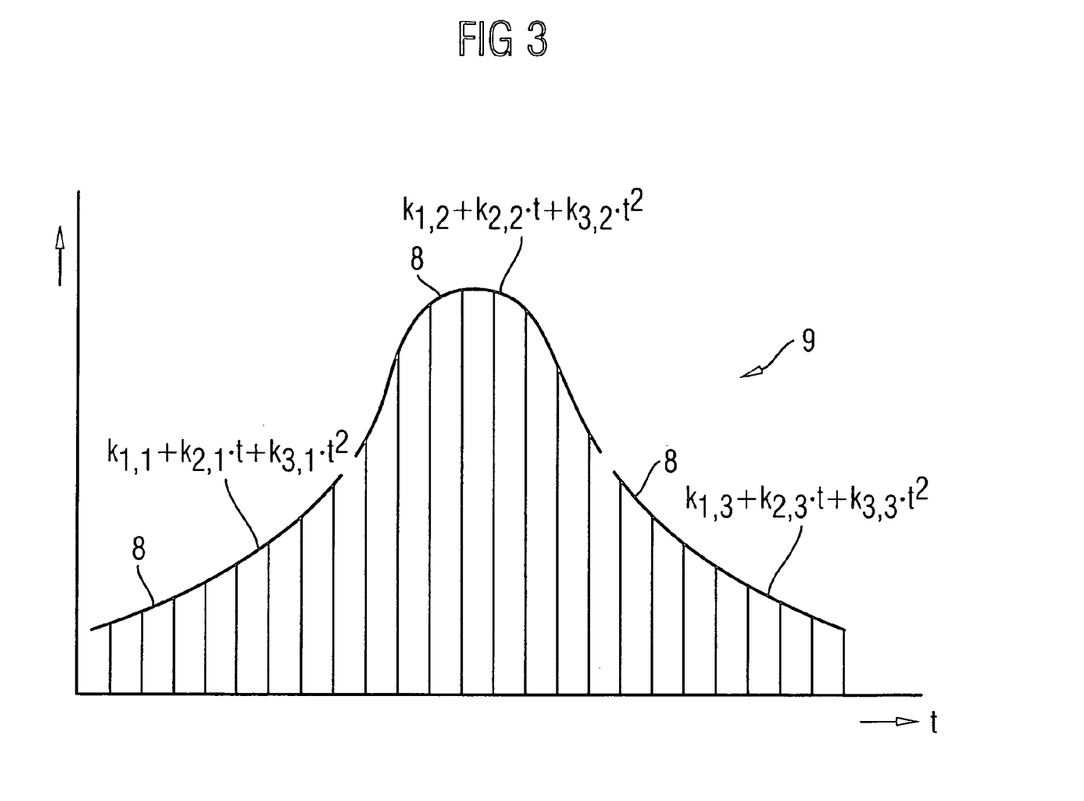
FIG. 3 illustrates a pulse response from an FIR filter which is to be produced with a filter according to one embodiment and is divided into various segments.

In one embodiment, the following procedures are adopted in order to determine the coefficients of the decimation filter 11 or interpolation filter 10, so that this decimation filter 11 or interpolation filter 10 has a transfer function corresponding to a predetermined FIR filter, as described hereinafter with reference to one embodiment of a pulse response as illustrated in FIG. 3.

The embodiment of pulse response 9 of the predetermined FIR filter, which is illustrated in FIG. 3 and, in the selected example, possesses 24 support points, is determined in a first step. In FIG. 3, the time is plotted on the X axis and the amplitude on the Y axis. If the decimation factor or interpolation factor N is selected as 8, the pulse response 9 can be divided into three equally long segments 8 of length 8 (eight support points in each case), so that the factor L is selected as 3. If the three segments 8 are now approximated by respective second order polynomials, as illustrated in FIG. 3, the factor M is also adjusted to 3, i.e. M−1 corresponds to the order of the polynomials. The coefficients $K^I_{1,1}$-$K^I_{3,3}$ of the interpolation filter 10 as well as the coefficients $K^D_{1,1}$-$K^D_{3,3}$ of the decimation filter 11 can be calculated from the coefficients $k_{1,1}$-$k_{3,3}$ of the polynomials determined from the approximation.

If the number of support points of the segments (8 in FIG. 3) is equal to M (i.e., the number of support points is 1 greater than the order of the polynomials), the support points are determined exactly so there is no approximation.

Calculation of the coefficients of a decimation filter according to one embodiment will be described in greater detail by the following example. It is assumed that a low pass of which the transfer function is a Hamming window and of which the pulse response has 128 support points, is to be produced by the decimation filter according to an example embodiment. The value W of the 128 support points is calculated by the following formula:

$$W(k) = 0.54 - 0.46 \times \cos\left(\frac{2 \times \Pi \times k}{127}\right),$$

where $0 \leq k \leq 127$

Figure 4:
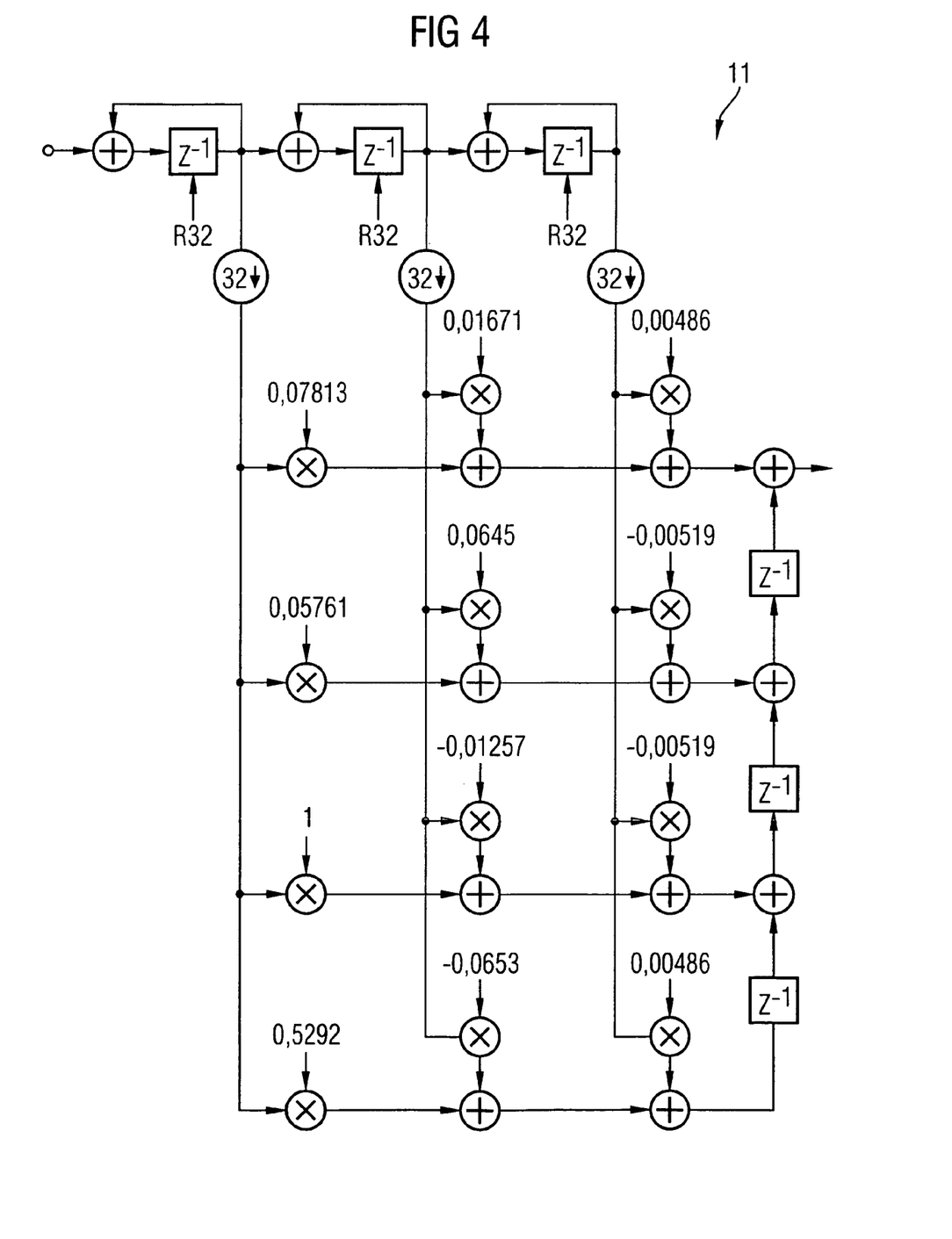
FIG. 4 illustrates a filter according to one embodiment, the coefficients being selected in such a way that the transfer function of the filter according to the embodiment is equal to a predetermined Hamming window.

If the factor N (i.e., the decimation factor), is selected as 32, the pulse response is divided into four segments (i.e., L=4) with 32 support points each, so these four segments can each be approximated to a polynomial. In this example, the four segments are each approximated to a square polynomial, second order polynomial (i.e., M=3), even though a power series development of the cosine also has much higher powers. The four polynomials thus determine 12 coefficients, from which the 12 coefficients of the weighting network of the decimation filter 11 are then determined. FIG. 4 illustrates the decimation filter 11, the coefficients of the weighting network indicated in FIG. 4 having been calculated by the previously sketched method. The decimation factor is 32, which means that:

the registers of the integrator stage are clocked 32 times as fast as the registers of the further stage;

the registers of the integrator stage are reset to 0 after every $32^{nd}$ clock pulse of the integrator stage; and the output values of the registers of the integrator stage are taken over by the further stage after every $32^{nd}$ clock pulse of the integrator stage.

Figure 5:
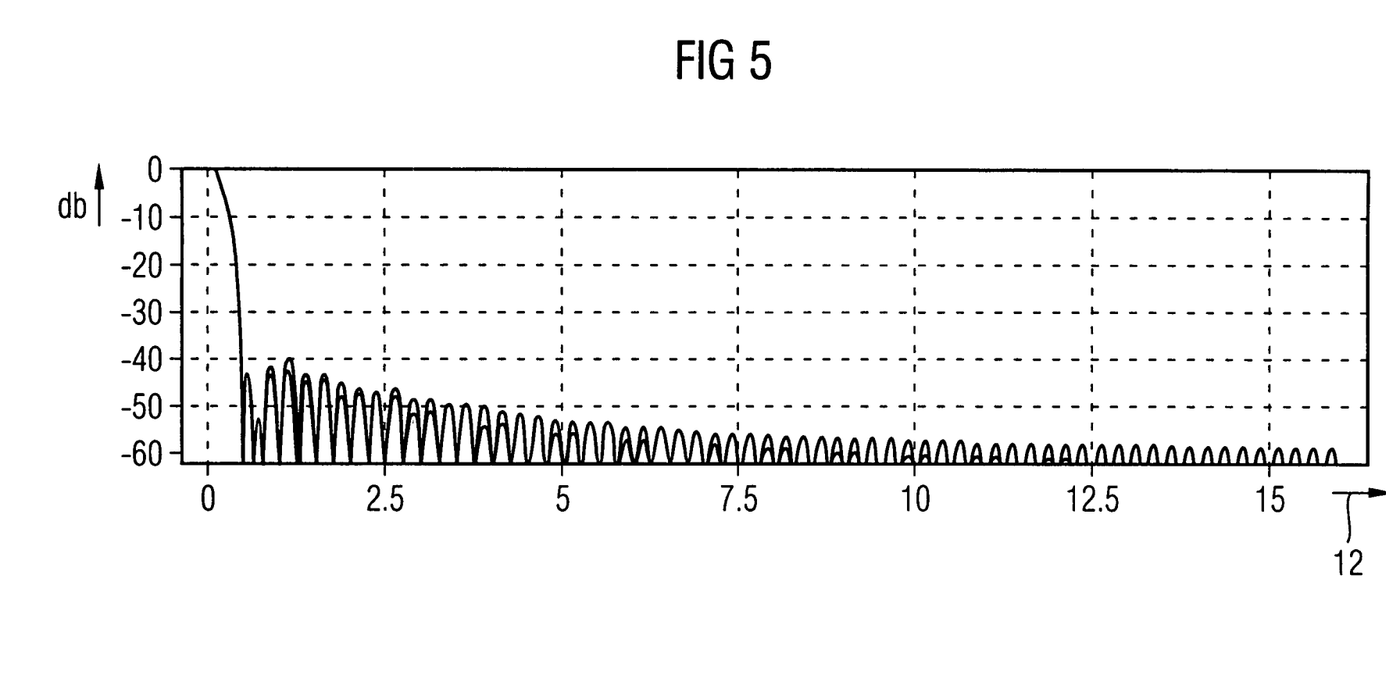
FIG. 5 illustrates the transfer function of the frequency response of the Hamming window in comparison to the transfer function of the filter according to one embodiment approximated thereto.

FIG. 5 illustrates the transfer function of the original Hamming window together with the transfer function of the decimation filter 11 according to one embodiment. The ratio of the frequency to the frequency of the integrator stage is illustrated on the X axis whereas the attenuation is illustrated on the Y axis. It can be seen that the transfer function of the decimation filter 11 according to the embodiment coincides sufficiently well with the transfer function of the original Hamming window. It should be remembered that 128 commands are typically performed on a digital signal processor (DSP) in order to calculate an output value of the original Hamming window, a command denoting multiplication of a coefficient by an input value and addition to an intermediate sum. On the other hand, only 15 such commands (i.e., 12 coefficients and 1 respective summation node at the output of the 3 registers of the further stage) are employed for calculating an output value of the decimation filter 11 according to the embodiment illustrated in FIG. 4. In other words, the effort of the calculation of an output value of the decimation filter 11 according to the embodiment of FIG. 4 is only 11.7% of the effort required to calculate an output value of the original Hamming window.

In a further comparison between conventional decimation filters or interpolation filters and decimation filters or interpolation filters according to some embodiments, it is found that, at a predetermined output value rate, the effort increases proportionally to the factor N (decimation factor) in the case of conventional filters whereas only the word width of multipliers has to be adapted in the case of filters according to some embodiments as the closed-loop controlled registers are reset less frequently so they accumulate to a greater extent. With the filters according to some embodiments, however, the number of multipliers remains constant.

According to one embodiment, it is possible further to reduce the effort for calculating the output values by combining a plurality of commands in the filters. This is beneficial, in particular, if the filter embodiment operates at a very high frequency and is implemented directly in hardware (and not by means of a DSP). A combination of a plurality of commands will be explained in greater detail hereinafter. It is assumed that there exist an interpolation filter according embodiment of FIG. 1 and a decimation filter according embodiment of FIG. 2, which produce a third order comb filter and of which the coefficients are shown in Table 1.

TABLE 1

Coefficients of the filter according to one embodiment.

| $K^I_{i,j}$ or $K^D_{i,1}$ | j = 1 | j = 2 | j = 3 |
|---|---|---|---|
| i = 1 | 0 | 0 | 1 |
| i = 2 | (N − 1) * N/2 | N | −2 |
| i = 3 | (N + 1) * N/2 | −N | 1 |

In the foregoing Table 1, $K^I_{2,1}=(n-1)*N/2=K^D_{2,1}$, applies, for example, to the coefficients, cf. FIG. 1 and FIG. 2. In this embodiment, N is the decimation factor or interpolation factor.

Figure 6:
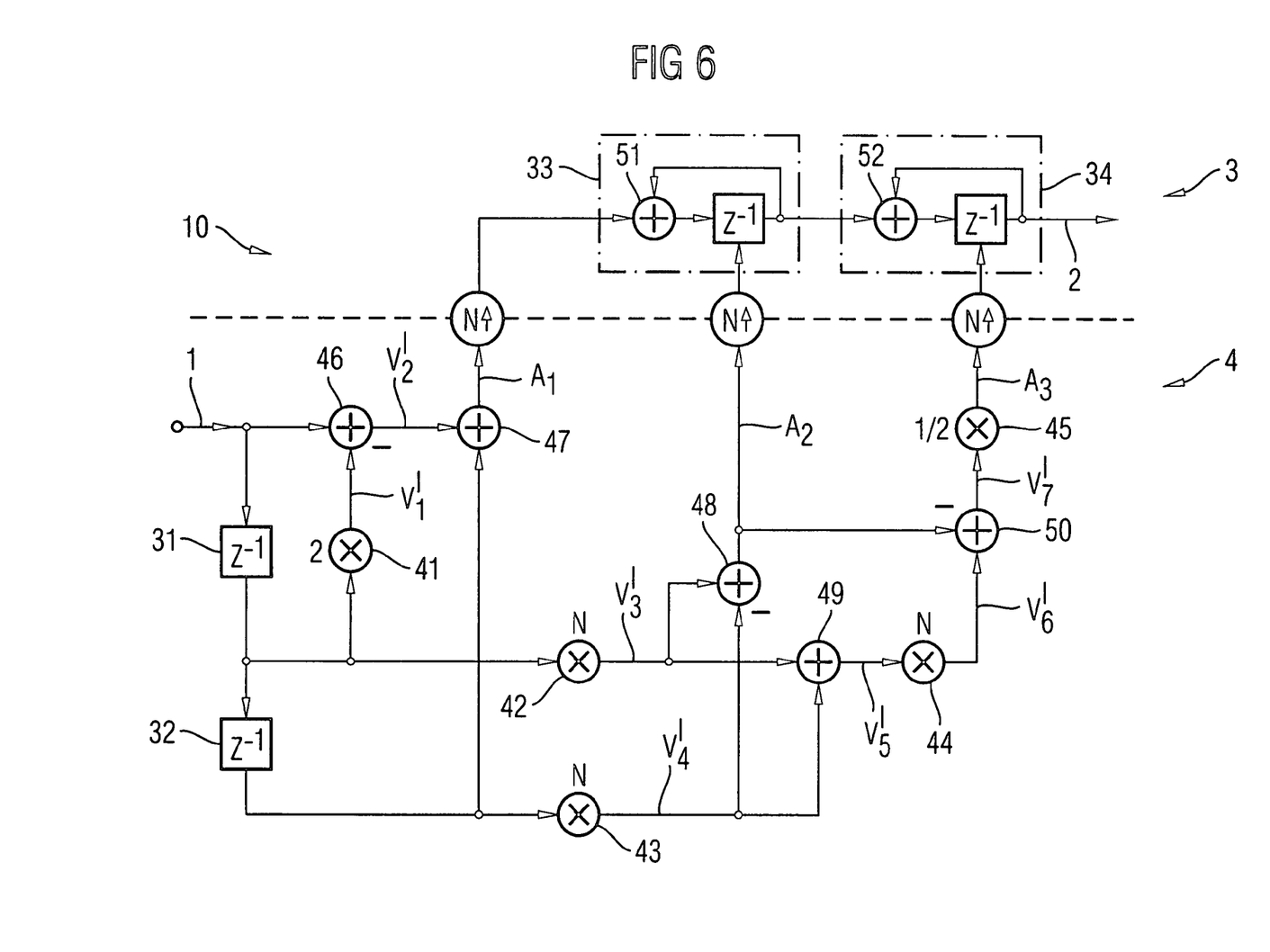
FIG. 6 illustrates an example embodiment of an interpolation filter.

In one embodiment, an interpolation filter 10 with the coefficients shown in Table 1 can be further simplified by combining various commands, as illustrated in FIG. 6.

The interpolation filter 10 according to one embodiment comprises, on the input side, a further stage 4 and, on the output side, an integrator stage 3. The registers 31, 32 of the further stage 4 are clocked with the clock pulse of the further stage 4 and the closed-loop controlled registers 33, 34 of the integrator stage 3 with the clock pulse of the integrator stage 3. The clock pulse of the integrator stage 3 is N-times faster than the clock pulse of the further stage 4.

The input signal 1 is fed, on the one hand, to a summation node 46 and, on the other hand, to a first register 31 of the further stage 4. The output of the first register 31 is fed to a second register 32 of the further stage 4, a multiplier 41 and a multiplier 42. The multiplier 41 multiplies the output value of the first register 31 by 2, an emerging output value $V^I_1$ of the multiplier 41 being subtracted by the summation node 46 from the input value 1 of the interpolation filter 10 to produce a value $V^I_2$ which is fed to a summation node 47. In this summation node 47, the value $V^I_2$ is added to the output value of the second register 32, to produce a first output value $A_1$ of the further stage 4. The output value of the first register 31 is multiplied by N by the multiplier 42, producing a value $V^I_3$. The output value of the second register 32 is multiplied by N by a multiplier 43 to produce a value $V^I_4$. The value $V^I_4$ is subtracted from the value $V^I_3$ in a summation node 48 to produce a second output value $A_2$ of the further stage 4. The value $V^I_3$ is added to the value $V^I_4$ in a further summation node 49 to produce a value $V^I_5$. The value $V^I_5$ is multiplied by N using the multiplier 44 to produce a value $V^I_6$. The second output value $A_2$ is subtracted from the value $V^I_6$ by a summation node 50 to produce a value $V^I_7$. The value $V^I_7$ is halved by a multiplier 45 to calculate a third output value $A_3$.

After each Nth clock pulse (N corresponds to the interpolation factor) of the integrator stage 3, the three output values $A_1$-$A_3$ of the further stage 4 are taken over by the integrator stage 3 as follows. The second output value $A_2$ is loaded into a first closed-loop controlled register 33 of the integrator stage 3 and the third output value $A_3$ is loaded into a second closed-loop controlled register 34 of the integrator stage 3. On the other hand, the first output value $A_1$ is fed to a summation node 51 to which the output of the first closed-loop controlled register 33 is also fed. The output of this summation node 51 is connected to the input of the first closed-loop controlled register 33. The output of the first closed-loop controlled register 33 is connected to a summation node 52 to which the output of the second closed-loop controlled register 34 is also fed and of which the output is connected to the input of the second closed-loop controlled register 34. The output of the second closed-loop controlled register 34 is also the output 2 of the integrator stage and therefore of the interpolation filter 10.

Assuming that the input values of the interpolation filter 10 can be a maximum of 1, the maximum values which are taken from the further stage 4 into the closed-loop controlled registers 33, 34 of the integrator stage 3 can be calculated. For the embodiment illustrated in FIG. 6, these are 2*N for the first closed-loop controlled register 33 and $N^2$ for the second closed-loop controlled register 34. In other words, the word width of the closed-loop controlled register decreases toward the input of the interpolation filter 10, which is the opposite to conventional comb filters.

In addition, the closed-loop controlled registers 33, 34 can also be replaced by analogue integrators in an embodiment which is not illustrated as, owing to the resetting, it is not possible for the (analogue) integrators to overrun.

Figure 7:
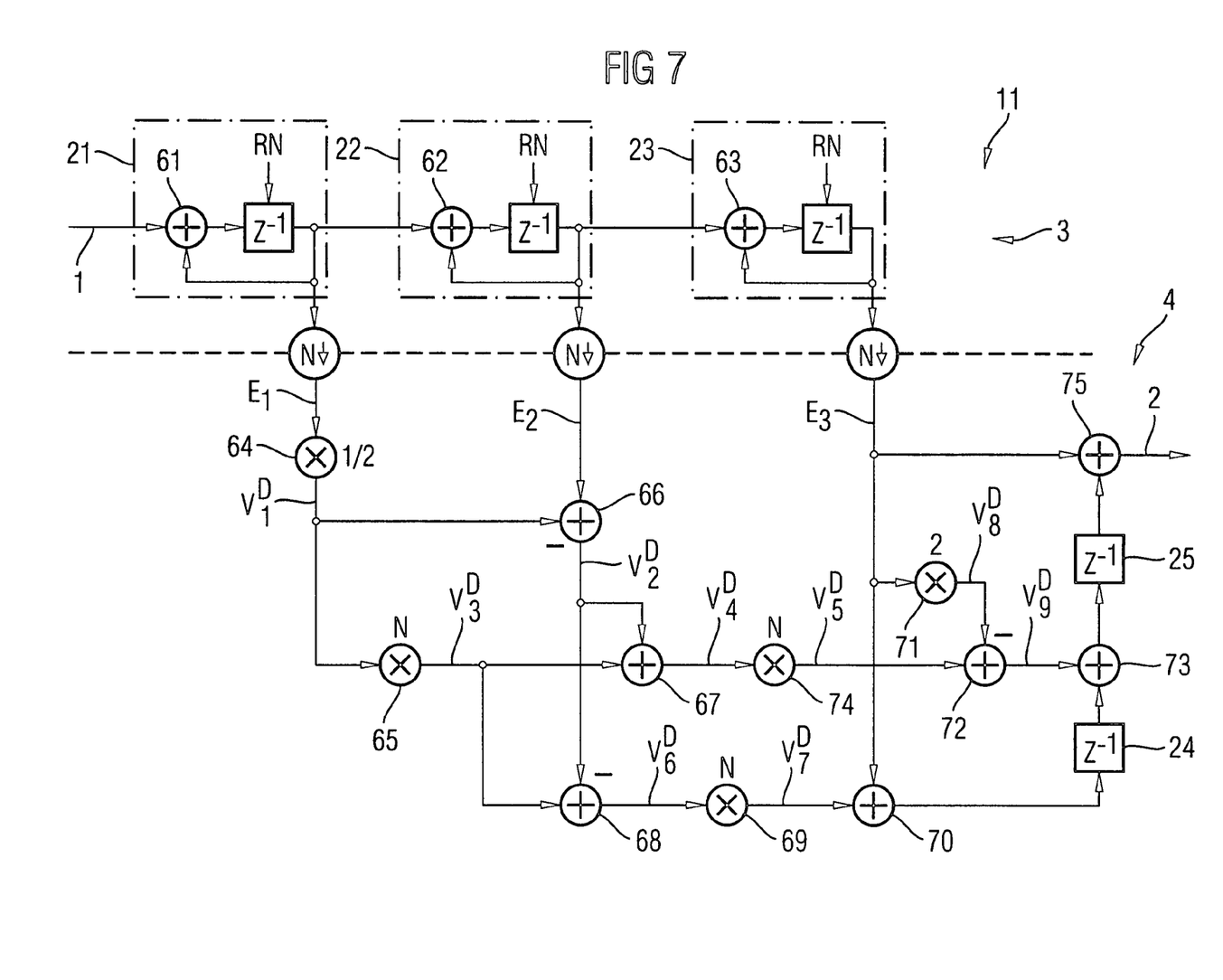
FIG. 7 illustrates an example embodiment of a decimation filter.

A decimation filter 11 according to one embodiment can also be produced in a similar manner, as illustrated in FIG. 7. The decimation filter 3 also possesses an integrator stage 3 and a further stage 4. The registers 21-23 of the integrator stage 3 are clocked with the clock pulse of the integrator stage 3 and the registers 24, 25 of the further stage 4 are clocked with the clock pulse of the further stage 4. As with the interpolation filter 10, the clock pulse of the integrator stage 3 is also N times faster than the clock pulse of the further stage 4 with the decimation filter 11.

The input of the integrator stage 3 and therefore of the decimation filter 11 is connected to a summation node 61 to which the output of the first closed-loop controlled register 21 of the integrator stage 3 is also connected, the output of this summation node 61 being fed to the first closed-loop controlled register 21. The output of the first closed-loop controlled register 21 is also fed to a summation node 62 to which the output of the second closed-loop controlled register 22 is in turn fed and of which the output is fed to the second closed-loop controlled register 22 on the input side. The output of the second closed-loop controlled register 22 is similarly also fed to a further summation node 63 to which the output of the third closed-loop controlled register 23 is likewise fed, the output of the summation node 63 being connected to the input of the third closed-loop controlled register 23.

For each Nth clock pulse of the integrator stage 3, the three closed-looped controlled registers 21-23 are reset to 0. In addition, the output values (prior to resetting) of the three closed-loop controlled registers 21-23 are taken over by the further stage 4 at this instant and form three input values $E_1$-$E_3$ of the further stage. The first input value $E_1$ is halved in a multiplier 64 and therefore produces a value $V^D{}_1$. The value $V^D{}_1$ is deducted from the second input value $E_2$ in a summation node 66, producing a value $V^D{}_2$. The value $V^D{}_1$ is multiplied by N in a further multiplier 65 to produce a value $V^D{}_3$. The value $V^D{}_2$ is counted together with the value $V^D{}_3$ in a summation node 67 to produce a value $V^D{}_4$. This value $V^D{}_4$ is multiplied by N in a multiplier 74 to produce a value $V^D{}_5$. The value $V^D{}_2$ is deducted from the value $V^D{}_3$ in a summation node 68 to produce a value $V^D{}_6$. The value $V^D{}_6$ is multiplied by N in a multiplier 69 to obtain a value $V^D{}_7$. The third input value $E_3$ is added to the value $V^D{}_7$ in a summation node 70 and fed to a first register 24 of the further stage 4 on the input side. The third input value $E_3$ is multiplied by 2 by a multiplier 71 to produce a value $V^D{}_8$. The value $V^D{}_8$ is deducted from the value $V^D{}_5$ in a summation node 72 to produce a value $V^D{}_9$. The summation of the output of the first register 24 and the value $V^D{}_9$ is carried out in a summation node 73 of which the output is fed to a second register 25 of the further stage 4. The third input value $E_3$ and the output of the second register 25 are added in a summation node 75, producing the output value 2 of the further stage 4 and therefore the output value 2 of the decimation filter 11 according to the invention.

Assuming that the input value of the decimation filter 11 is a maximum of 1, the highest possible value which the closed-loop controlled registers 21-23 can each have as a maximum can be calculated. For a decimation factor N of 16, the maximum value of the first closed-loop controlled register 21 is 16, that of the second closed-loop controlled register 22 is 128 and that of the third closed-loop controlled register 23 is 688. It is therefore sufficient to design the first closed-loop controlled register 21 with a capacity of 5 bit, the second closed-loop controlled register 22 with a capacity of 8 bit and the third closed-loop controlled register 23 with a capacity of 10 bit. This is comparable to a conventional third order comb filter with a maximum value of 4096 which corresponds to a capacity of 12 bit.

In one embodiment, only one multiplication by 2, one multiplication by ½ and three multiplications by N respectively have to be carried out with the interpolation filter 10 of FIG. 6 and with the decimation filter 11 of FIG. 7. Multiplication by 2 is performed by a shift operation by 1 bit to the highest value bit and multiplication by ½ by a shift operation by 1 bit to the lowest value bit. If N is suitably selected, for example as a power of 2, multiplication by N is also performed by a shift operation, for example by 1d(N) bits to the highest value bit.

In one embodiment, any bit error which has crept in, for example due to leakage, is corrected or eliminated at the latest after N clock pulses of the integrator stage 3 owing to the setting of the closed-loop controlled registers of the integrator stage 3 every N clock pulses.

In addition, the clock frequency of the integrator stage can be selected very high as the integrators of the integrator stage 3 are embodied by closed-loop controlled registers.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A decimation filter circuit configured to convert a digital input sequence into a digital output sequence, the decimation filter circuit comprising:
    an integrator circuit stage comprising a plurality of closed-loop controlled time-delay elements, wherein the integrator circuit stage is arranged on an input side of the decimation filter circuit; and
    a further circuit stage, wherein the further circuit stage is arranged on an output side of the decimation filter circuit, wherein the integrator circuit stage operates at a higher clock frequency than the further circuit stage, wherein the further circuit stage comprises, on the input side, a weighting network and, on the output side, a time-delay element network comprising at least one time-delay element, wherein output signals from the integrator circuit stage are fed on the input side to the weighting network and output signals of the weighting network are fed on the input side to the time-delay element network,
    wherein the time-delay of each of the time-delay elements of the integrator circuit stage is equal to the time-delay of each of the at least one time-delay element of the further circuit stage.

2. The decimation filter circuit according to claim 1, wherein the integrator circuit stage is configured to have each closed-loop controlled time-delay element set, at an instant which is identical for all closed-loop controlled time-delay elements, to the value which is predetermined for the respective closed-loop controlled time-delay element.

3. The decimation filter circuit according to claim 2, wherein the integrator circuit stage is configured to have the setting to the predetermined value occur periodically.

4. The decimation filter circuit according to claim 1, wherein the predetermined value, to which each closed-loop controlled time-delay element is set, is 0 for all closed-loop controlled time-delay elements.

5. The decimation filter circuit according to claim 1, wherein the closed-loop controlled time-delay elements of the integrator circuit stage comprise analogue integrators.

6. The decimation filter circuit according to claim 1, wherein the closed-loop controlled time-delay elements of the integrator circuit stage comprise closed-loop controlled registers which are clocked with a clock pulse of the integrator circuit stage.

7. The decimation filter circuit according to claim 6, wherein each closed-loop controlled register has a respective word width dependent on a configuration of the digital filter which is sufficient to process any desired input sequence of the digital filter without an overrun.

8. The decimation filter circuit according to claim 1, wherein the further circuit stage comprises time-delay elements which are clocked with a clock pulse of the further circuit stage.

9. The decimation filter circuit according to claim 1, wherein the weighting network prepares input signals for the time-delay element network with a linear combination of the output signals of the integrator circuit stage.

10. The decimation filter circuit according to claim 1, wherein the closed-loop controlled time-delay elements of the integrator circuit stage are arranged in series.

11. The decimation filter circuit according to claim 1, wherein the at least one time-delay element of the further circuit stage comprises a plurality of time-delay elements arranged in series.

12. The decimation filter circuit according to claim 1, wherein a respective Nth value of each output of the closed-loop controlled time-delay elements represents an input value of the further circuit stage.

13. The decimation filter circuit according to claim 1, wherein the further circuit stage comprises L portions and L−1 time-delay elements, L being greater than 1, in that each portion is configured in such a way that it performs a function $$S_i^D = \sum_{j=1}^{M} E_j \times K_{i,j}^D,$$

in which i ranges from 1 to L and is an index of the corresponding portion, j is an index of the corresponding input value of the further circuit stage, M indicates the number of closed-loop controlled time-delay elements of the integrator circuit stage, $E_j$ is an input value of the further circuit stage, $K_{i,j}^D$ is a coefficient and $S_i^D$ is an output value of the ith portion, wherein the sum $S_L^Q$ is fed to the first time-delay element of the further circuit stage, and wherein the output of each time-delay element of the further circuit stage is linked with the respective sum $S_i^D$, in which i ranges from 1 to L−1.

14. The decimation filter circuit according to claim 13, wherein the coefficients are adjusted in such a way that zero points of the transfer function of the digital filter lie side by side.

15. The decimation filter circuit according to claim 1, wherein the integrator circuit stage comprises a first closed-loop controlled time-delay element connected on the input side to the input of the filter, a second closed-loop controlled time-delay element connected on the input side to the output of the first closed-loop controlled time-delay element, and a third closed-loop controlled time-delay element connected on the input side to the output of the second closed-loop controlled time-delay element, wherein a respective Nth value of the output of a first closed-loop controlled time-delay element of the further circuit stage is provided as the first input value, an Nth value of the output of a second closed-loop controlled time-delay element of the further circuit stage is provided as the second input value, and an Nth value of the output of a third closed-loop controlled time-delay element of the further circuit stage is provided as the third input value, a first variable is determined by dividing the first input value by 2, a second variable is determined by deducting the first variable from the second input value, in that a third variable is determined by multiplying the first variable by N, in that a fourth variable is determined by adding the second variable and the third variable, in that a fifth variable is determined by multiplying the fourth variable by N, in that a sixth variable is determined by deducting the second variable from the third variable, in that a seventh variable is determined by multiplying the sixth variable by N, in that an eighth variable is determined by multiplying the third input value by 2, in that a ninth variable is determined by deducting the eighth variable from the fifth variable, in that a sum of the seventh variable and the third input value are fed to a first time-delay element of the further circuit stage on the input side, in that a sum of the output value of the first time-delay element of the further circuit stage and the ninth variable are fed to a second time-delay element of the further circuit stage on the input side, and in that a sum of the output value of the second time-delay element of the further circuit stage and the third input value produces the value of the output of the filter.

16. The decimation filter circuit according to claim 1, wherein the weighting network is configured to perform a multiplication or division by a number Z, wherein Z satisfies the following equation: $Z=2^n$ where n∈N, is performed by a shift operation by n, shifting occurring in the direction of the highest value bit during multiplication and in the direction of the lowest value bit during division.

17. The decimation filter circuit according to claim 1, wherein the integrator circuit stage is configured to have each closed-loop controlled time-delay element set to a value which is predetermined for the respective closed-loop controlled time-delay element.

* * * * *

UNITED STATES PATENT AND TRADEMARK OFFICE
CERTIFICATE OF CORRECTION

PATENT NO. : 8,775,492 B2
APPLICATION NO. : 11/410395
DATED : July 8, 2014
INVENTOR(S) : Andreas Menkhoff and Holger Gryska

Page 1 of 1

It is certified that error appears in the above-identified patent and that said Letters Patent is hereby corrected as shown below:

In the Claims

Column 11, line 32, delete "SQL" and write "SDL", where "D" is a superscripted and "L" is a subscripted character in place thereof. As shown below.
"$S^D_L$"

Signed and Sealed this
Fourteenth Day of July, 2015

Michelle K. Lee
*Director of the United States Patent and Trademark Office*